United States Patent
Kim et al.

(10) Patent No.: US 8,269,342 B2
(45) Date of Patent: Sep. 18, 2012

(54) SEMICONDUCTOR PACKAGES INCLUDING HEAT SLUGS

(75) Inventors: Yonghoon Kim, Suwon-si (KR); Heeseok Lee, Yongin-si (KR); Eunseok Cho, Suwon-si (KR); Hyuna Kim, Hwaseong-si (KR); Soyoung Lim, Hwaseong-si (KR); PaLan Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 128 days.

(21) Appl. No.: 12/801,274

(22) Filed: Jun. 1, 2010

(65) Prior Publication Data
US 2011/0018119 A1    Jan. 27, 2011

(30) Foreign Application Priority Data
Jul. 21, 2009    (KR) .................. 10-2009-0066357

(51) Int. Cl.
*H01L 23/34* (2006.01)
(52) U.S. Cl. ........ 257/720; 257/713; 257/706; 257/707; 257/796; 438/122; 438/127; 438/638

(58) Field of Classification Search ............... 257/690, 257/678, 675, 667, 720, 708, 704, 777, 778, 257/779, 780, 781, 782, 783, 784, 787, 788, 257/791, 792, 796, E23.023, E23.08, 712, 257/713, 723, 731, 774, 793, 794; 438/108, 438/109, 110, 111, 112, 121, 127, 123, 106, 438/FOR. 413, 637, 638, 639, 640, 629, 672, 438/675, 122, 126
See application file for complete search history.

(56) References Cited

U.S. PATENT DOCUMENTS

| | | | |
|---|---|---|---|
| 6,469,380 B2 | 10/2002 | Sorimachi et al. | |
| 2002/0074668 A1 | 6/2002 | Hofstee et al. | |
| 2002/0084523 A1 | 7/2002 | Sorimachi et al. | |
| 2002/0121694 A1 | 9/2002 | Gaynes et al. | |
| 2003/0116836 A1 * | 6/2003 | Huang et al. | 257/678 |
| 2004/0099944 A1 | 5/2004 | Kimura | |
| 2006/0172457 A1 * | 8/2006 | Huang | 438/106 |

FOREIGN PATENT DOCUMENTS

| | | |
|---|---|---|
| JP | 08-097336 | 4/1996 |
| JP | 2002-151633 | 5/2002 |
| KR | 10-2003-0041653 | 5/2003 |
| KR | 10-2004-0001019 | 1/2004 |

* cited by examiner

*Primary Examiner* — Ha Tran T Nguyen
*Assistant Examiner* — Thanh Y Tran
(74) *Attorney, Agent, or Firm* — Harness, Dickey & Pierce, P.L.C.

(57) ABSTRACT

A semiconductor package may include at least one semiconductor chip mounted on a substrate, a molding layer adapted to mold the at least one semiconductor chip, a heat slug, on the molding layer, having a structure in which a dielectric is provided between conductors, and a through mold via electrically connecting the heat slug to the substrate.

17 Claims, 12 Drawing Sheets

SEMICONDUCTOR PACKAGES INCLUDING HEAT SLUGS

CROSS-REFERENCE TO RELATED APPLICATION(S)

This application claims priority from Korean Patent Application No. 10-2009-0066357, filed on Jul. 21, 2009, in the Korean Intellectual Property Office (KIPO), the entire contents of which are incorporated herein by reference.

BACKGROUND

1. Field

Example embodiments relate to semiconductor packages. Also, example embodiments relate to semiconductor packages including heat slugs.

2. Description of the Related Art

Owing to high speed and/or high frequency of semiconductor devices, thermal and/and electrical problems may be getting worse. Heat slugs may generally be used to improve thermal characteristics of semiconductor devices. Heat slugs may be mainly formed of conductors and/or bonded-on molding layers. Heat slugs may absorb heat from semiconductor chips and/or packages in order to radiate the heat, which may improve thermal characteristics of semiconductor packages.

However, heat slugs may not be enough to improve electrical characteristics of semiconductor packages, because the heat slugs are planned for thermal characteristics of semiconductor packages. Therefore, there may be a need to improve semiconductor packages to electrical characteristics as well as thermal characteristics thereof.

SUMMARY

Example embodiments may provide semiconductor packages including heat slugs.

According to example embodiments, a semiconductor package may include at least one semiconductor chip mounted on a substrate, a molding layer to mold the at least one semiconductor, a heat slug on the molding layer having a capacitor-like structure where a dielectric is provided between conductors, and/or a through mold via electrically connecting the heat slug to the substrate.

According to example embodiments, the through mold via may include a first via electrically connecting one of the conductors to the substrate and/or a second via electrically connecting other one of the conductors to the substrate. The first via may be connected to said one of the conductors and/or the second via is connected to said other one of the conductors.

According to example embodiments, the heat slug may include one of first and second openings. The first opening may provide a first space through which the first via may be connected to said one of the conductors, but insulated from said other one of the conductors. The first opening may penetrate the dielectric and/or said other one of the conductors. The second opening may provide a second space through which the second via may be connected to said other one of the conductors, but insulated from said one of the conductors. The second opening may penetrate the dielectric and/or said one of the conductors.

According to example embodiments, the through mold via may include a first through mold via including a first power via and/or a first ground via, the first through mold via directly connecting the heat slug to the substrate, and a second through mold via including a second power via and/or a second ground via, the second mold via directly connecting the heat slug to the at least one semiconductor chip such that the heat slug is indirectly connected to the substrate.

According to example embodiments, the substrate may include a first power pad connected to the first power via and/or a first ground pad connected to the first ground via.

According to example embodiments, the at least one semiconductor chip may include a second power pad connected to the second power via and/or a second ground pad connected to the second ground via.

According to example embodiments, the at least one semiconductor chip may include a first through electrode electrically connected to the second power via using second power pad and/or a second through electrode electrically connected to the second ground via using the second ground pad.

According to example embodiments, the heat slug may include a power plane to which the first and second power vias may be connected together and/or a ground plane to which the first and second ground vias may be connected together.

According to example embodiments, the heat slug may comprise: a power plane to which the first and second power vias are connected together, a first ground plane to which the first ground via may be connected, and/or a second ground plane to which the second ground via may be connected. The power plane may be provided between the first and second ground planes.

According to example embodiments, the heat slug may include a ground plane to which the first and second ground planes may be connected together, a first power plane to which the first power via may be connected, and/or a second power plane to which the second power via may be connected.

According to example embodiments, the heat slug may include a first subsidiary heat slug including a first power plane to which the first power via may be connected and/or a first ground plane to which the first ground via may be connected, and/or a second subsidiary heat slug including a second power plane to which the second power via may be connected and/or a second ground plane to which the second ground via may be connected. One of the first and second subsidiary heat slugs may be provided on the other.

According to example embodiments, a semiconductor package may include at least one semiconductor chip mounted on a substrate, a molding layer adapted to mold the at least one semiconductor chip, a heat slug, on the molding layer, having a structure in which a dielectric is provided between conductors, and/or a through mold via electrically connecting the heat slug to the substrate.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1A:
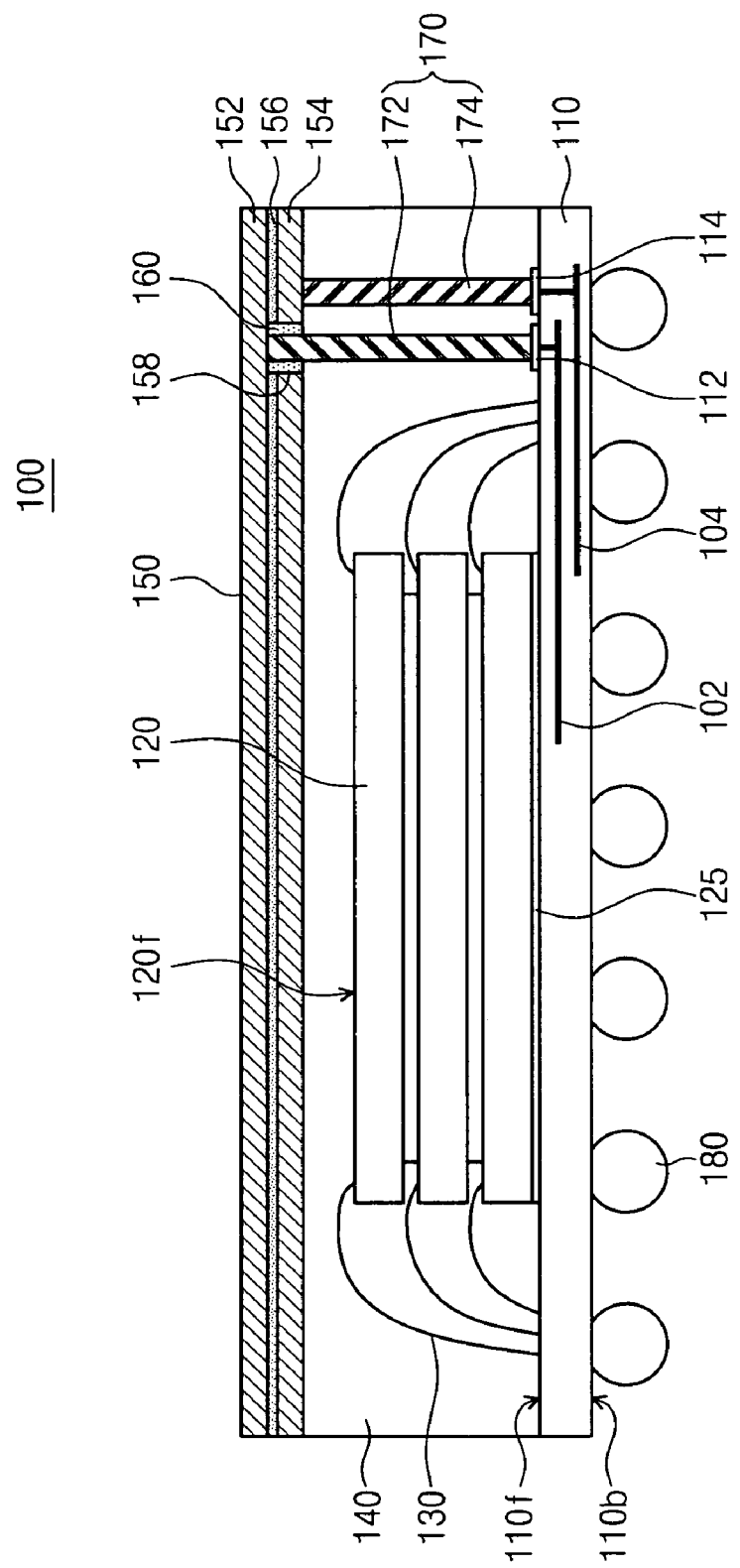
FIG. 1A is a cross sectional view illustrating a semiconductor package according to example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1A is a cross sectional view illustrating a semiconductor package according to example embodiments. Referring to FIG. 1A, semiconductor package 100 may include heat slug 150 electrically connected to substrate 110 using first through mold via 170.

Semiconductor package 100 may include, for example, substrate 110 on which plurality of semiconductor chips 120 may be mounted. Semiconductor chips 120 may be molded by molding layer 140. Semiconductor chips 120 may be memory chips, logic chips, or combinations thereof. Substrate 110 may be a printed circuit board that may include electrical member 102 (e.g., power pin or power plane, for providing power to semiconductor chips 120), and/or electrical member 104 (e.g., ground pin or ground plane, for grounding semiconductor chips 120). In example embodiments, electrical member 102 for providing power also may be called power member 102, and/or electrical member 104 for grounding also may be called ground member 104.

Semiconductor package 100 may include plurality of bonding wires 130 to electrically connect semiconductor chips 120 into substrate 110. One end of bonding wire 130 may contact active surface 120f of semiconductor chip 120 and/or the other end may contact top surface 110f of substrate 110. Some of plurality of bonding wires 130 may be connected to power member 102 and/or others may be connected to ground member 104. Plurality of external terminals 180, such as solder balls, may be attached to bottom surface 110b of substrate 110. External terminals 180 may electrically connect semiconductor package 100 to a device or devices. Adhesion layer 125 may be interposed between a bottommost one of plurality of semiconductor chips 120 and substrate 110, and/or between plurality of semiconductor chips 120.

Figure 7:
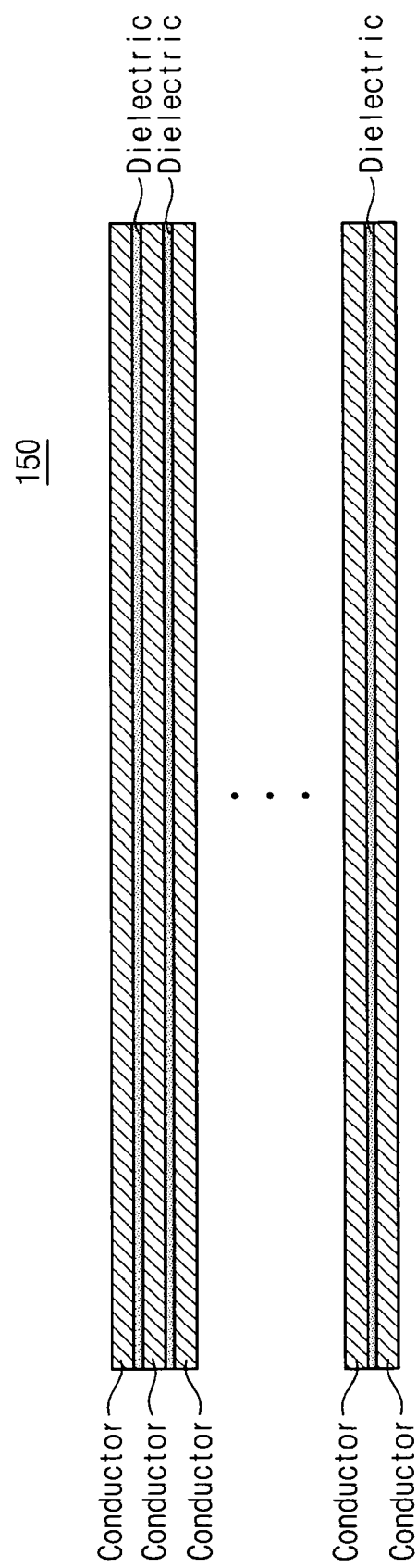
FIG. 7 is a cross sectional view illustrating a multiple capacitor-like heat slug according to example embodiments.

Heat slug 150 may be provided on molding layer 140. Heat slug 150 may, for example, be bonded to molding layer 140 by an adhesive. Heat slug 150 may be a plane structure that may include first conductor 152, second conductor 154, and dielectric 156 interposed between them. Heat slug 150 may comprise first opening 158 that may penetrate first dielectric 156, as well as second conductor 154 thereunder. Heat slug 150 may be a capacitor-like structure in which first dielectric 156 may be provided between two conductors 152 and 154, as depicted in FIG. 1A, or a multiple capacitor-like structure in which a plurality of dielectrics may be provided among a plurality of conductors, as depicted in FIG. 7.

Heat slug 150 may be electrically connected to substrate 110 using first through mold via 170. First through mold via 170 may be a vertically elongated conductor perforating through molding layer 140. First through mold via 170 may comprise first via 172 and/or second via 174. One of conductors 152 and 154 may be connected to first via 172, and/or the other may be connected to second via 174. For example, first conductor 152 may be connected to first via 172, and/or second conductor 154 may be connected to second via 174. For example, at least one first through mold via 170 may be further provided on an left edge of semiconductor package 100.

Semiconductor package 100 may comprise first pad 112 connected to first via 172 and/or second pad 114 connected to second via 174, on top surface 110f of substrate 110. According to example embodiments, first pad 112 may be a power pad that may be electrically connected to power member 102, and/or second pad 114 may be a ground pad that may be electrically connected to ground member 104. First conductor 152 may be electrically connected to power member 102 using first via 172, and/or second conductor 154 may be electrically connected to ground member 104 using second via 174.

According to example embodiments, first conductor 152 may function as a power plane and/or second conductor 154 may function as a ground plane. First via 172 may be electrically connected to bonding wire 130 for supplying power to semiconductor chips 120 using a first line (not shown) and/or second via 174 may be electrically connected to bonding wire 130 for grounding semiconductor chips 120 using a second line (not shown). The first and second lines may be provided on top surface 110f of substrate 110.

First via 172 may be connected to first conductor 152 through first opening 158. First insulation layer 160 may fill first opening 158 in order to insulate first via 172 from second conductor 154. An air gap may be formed within first opening 158 instead of using first insulation layer 160.

When heat slug 150 may be the multiple capacitor-like structure depicted in FIG. 7, at least one of the conductors may be used as the power plane and the others may be used as the ground planes. Multiple capacitor-like heat slugs may be explained later in detail with reference to FIGS. 1C and 1D.

Heat slug 150 may radiate heat generated from semiconductor package 100 such that characteristics of semiconductor package 100 may improve. Furthermore, heat slug 150 may improve electrical characteristics of semiconductor package 100 as described below.

According to example embodiments, heat slug 150 may be a planar capacitor-like structure in which first dielectric 156 may be provided between two conductors 152 and 154. Second conductor 154 of heat slug 150 may function as a ground plane. Consequently, semiconductor package 100 may comprise ground member 104 as well as another ground plane (second conductor 154) of which an area is greater than that of ground member 104. Semiconductor package 100 may therefore have good resistance to the effects of electrostatic discharge (ESD). Even if ground member 104 may not be provided in substrate 110, ground plane 154 of heat slug 150 may allow semiconductor package 100 to have good resistance to ESD. Therefore, heat slug 150 may improve not only characteristics of heat radiation, but also resistance ESD. Capacitance of heat slug 150 may be enlarged proportionally to reduction of the thickness of first dielectric 156 and/or to increase of the dielectric constant of first dielectric 156.

Impedance may deteriorate power integrity (PI) of semiconductor package 100. Because impedance may be proportional to inductance, but inversely proportional to capacitance, a capacitor may improve PI characteristics of semiconductor package 100. According to example embodiments, capacitor-like heat slug 150 may improve PI characteristics of semiconductor package 100. Since heat slug 150 may be the planar capacitor-like structure, it may improve impedance of high frequency in the range of GHz bands. Heat slug 150 may inhibit resonance generated from high frequency that may not suppressed by de-coupling capacitance of substrate 110, which may improve PI characteristic of semiconductor package 100. Consequently, semiconductor package 100 may be widely used as non-memory devices or memory devices operating at high speed, such as 500 MHz or more. In addition, because conductors 152 and 154 of heat slug 150 may be adhered to semiconductor package 100, heat slug 150 may absorb electrical fields and/or magnetic fields generated from semiconductor package 100 in order to improve electromagnetic interference (EMI).

As above mentioned, because heat slug 150 may improve PI, heat slug 150 may also improve Signal Integrity (SI) related to PI. Furthermore, due to improved PI characteristics, substrate 110 may have reduced layers and/or may not comprise a de-coupling capacitor for securing de-coupling capacitance.

Figure 4:
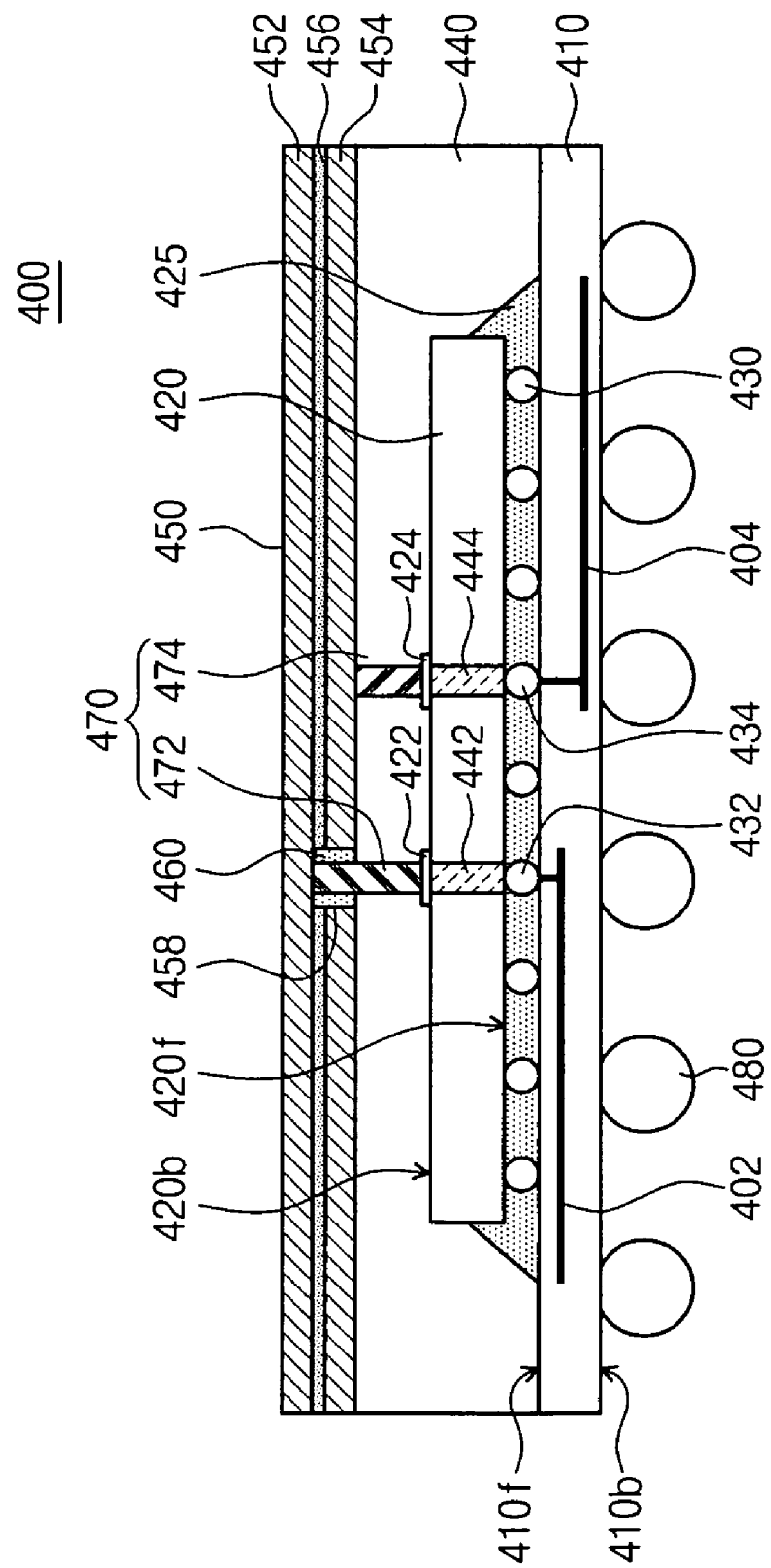
FIG. 4 is a cross sectional view illustrating a semiconductor package according to example embodiments.

These explanations may be applied to example embodiments in which first conductor 152 may be a power plane, first via 172 may be a power via, second conductor 154 may be a ground plane, and/or second via 174 may be a ground via. In the alternative, first conductor 152 may be a ground plane, first via 172 may be a ground via, second conductor 154 may be a power plane, and/or second via 174 may be a power via. Semiconductor chips 120 may be electrically connected to substrate 110 using through electrodes that may penetrate semiconductor chips 120, identical or analogous to those as shown in FIG. 4, instead of wire bonding.

Referring to FIG. 1A, semiconductor package 100 may be manufactured with diverse methods. For example, substrate 110, such as a printed circuit board (PCB), may be provided. First pad 112 and/or second pad 114 may be formed on top surface 110f of substrate 110. Power member 102, electrically connected to first pad 112, may be formed on top surface 110f of substrate 110. Ground member 104, electrically connected to second pad 114, also may be formed on top surface 110f of substrate 110. Substrate 110, on which pads 112 and 114 and members 102 and 104 may already be formed, may be provided.

At least one semiconductor chip 120 or plurality of semiconductor chips 120 may be stacked on top surface 110f of substrate 110. Adhesion layer 125 may be interposed between semiconductor chips 120 and top surface 110f of substrate 110. Bonding wires 130 may be formed to electrically connect semiconductor chips 120 to substrate 110. Bonding wires 130 also may electrically connect semiconductor chips 120 with each other. Some of bonding wires 130 may be electrically connected to power member 102, others of bonding wires 130 may be electrically connected to ground member 104. Alternatively, plurality of semiconductor chips 120 having at least one through electrode (not shown) may be stacked on substrate 110.

Molding layer 140 may be formed on top surface 110f of substrate 110 in order to mold semiconductor chips 120. Molding layer 140 may be formed of epoxy molding compound (EMC). A portion of molding layer 140 may penetrate to form a mold via hole that may expose second pad 114 using, for example, a laser drilling or etching process. Then the mold via hole may be filled with conductive material, e.g., metal and polysilicon, to form second via 174 that may penetrate molding layer 140 to be connected to second pad 114.

Second conductor 154 and/or first dielectric 156 may be formed on molding layer 140. Second conductor 154 may be formed of high conductivity material, such as Cu and/or Al. Second via 174 may be connected to second conductor 154. First dielectric 156 may comprise, for example, silicon oxynitride (e.g., SiON), silicon nitride (e.g., SiN, $Si_3N_4$), high dielectric (e.g., $(Ba,Sr)TiO_3$, $HfO2$, $Al_2O_3$, $Ta_2O_3$), or combinations thereof. First opening 158 may be formed by removing portions of first dielectric 156 and/or second conductor 154 using, for example, a laser drilling or etching process and/or first opening 158 may be filled with first insulation layer 160.

For example, first insulation layer 160 and/or molding layer 140 may be penetrated through laser drilling such that a mold via hole may be formed to expose first pad 112. The mold via hole may be filled with conductive material such as metal and/or polysilicon to form first via 172. First via 172 may be separated apart from second conductor 154 by first insulation layer 160.

First conductor 152 may be formed on first dielectric 156. First via 172 may be connected to first conductor 152. First conductor 152 may be formed of conductive material identical or analogous to that of second conductor 154. Plurality of external terminals 180 may be attached to bottom surface 110b of substrate 110.

According to example embodiments, first through mold via 170, including vias 172 and 174, may electrically connect substrate 110 to heat slug 150 in which first dielectric 156 may be provided between conductors 152 and 154. This method may manufacture semiconductor package 100 with improved thermal and electrical characteristics.

Referring again to FIG. 1A, semiconductor chips 120 may be molded by molding layer 140 and/or wire-bonded to substrate 110. Heat slug 150 may be provided on substrate 110. Heat slug 150 may comprise first conductor 152, second conductor 154, and first dielectric 156 interposed between them.

Molding layer 140 may be penetrated, through laser drilling, to form mold via holes exposing pads 112 and 114. The mold via holes may be filled with first via 172, that may be connected to first pad 112, and second via 174, that may be connected to second pad 114. First via 172 may have a length to penetrate molding layer 140.

Heat slug 150 may be worked to have first opening 158. For example, portions of second conductor 154 and first dielectric 156 may be removed to form first opening 158 by laser drilling. First insulation layer 160 may be removed partially to have a space that may expose first conductor 152 and/or the space may be filled with conductive material. This conductive material may be connected to first conductor 152 and/or may be a top part of first via 172.

Heat slug 150 may be adhered to molding layer 140 by an adhesive. Semiconductor package 100 may be manufactured by attaching plurality of external terminals 180 to bottom surface 110b of substrate 110.

Referring again to FIG. 1A, semiconductor chips 120 may be molded by molding layer 140 and/or wire-bonded to substrate 110. Heat slug 150 may be provided on substrate 110. Heat slug 150 may comprise first conductor 152, second conductor 154, and first dielectric 156 interposed between them.

A sacrificial layer (not shown) may be formed of insulating material on molding layer 140. The sacrificial layer and molding layer 140 may be partially removed by, for example, laser drilling and therefore mold via holes may be formed to expose pads 112 and 114. The mold via holes may be filled with conductive materials to form first via 172, that may be connected to first pad 112, and second via 174, that may be connected to second pad 114. Each of vias 172 and 174 may have a length greater than the thickness of molding layer 140. The sacrificial layer may be removed by, for example, a chemical or mechanical process. Top portions of vias 172 and 174 protruded over molding layer 140 may be removed when removing the sacrificial layer.

Heat slug 150 may be worked to form first opening 158 and/or a space may be formed in first opening 158 that may expose first conductor 152. The space may be filled with conductive material. The conductive material may be connected to first conductor 152 and/or may constitute a top part of first via 172. Heat slug 150 may be adhered to molding layer 140 by an adhesive and/or plurality of external terminals 180 may be attached to bottom surface 110b of substrate 110, which makes semiconductor package 100.

Referring again to FIG. 1A, semiconductor chips 120 may be molded by molding layer 140 and/or wire-bonded to substrate 110. Heat slug 150 may be provided on substrate 110. Heat slug 150 may comprise first conductor 152, second conductor 154, and first dielectric 156 interposed between them.

A sacrificial layer (not shown) may be formed of insulating material on molding layer 140. The sacrificial layer and molding layer 140 may be partially removed to form mold via holes exposing first and second pads 112 and 114. For example, the sacrificial layer and molding layer 140 may be removed by, for example, laser drilling. The mold via holes may be filled with conductive materials to form first via 172, that may be connected to first pad 112, and second via 174, that may be connected to second pad 114. Each of vias 172 and 174 may have a length greater than the thickness of molding layer 140. The sacrificial layer may be removed by, for example, an etching process. When removing the sacrificial layer using the etching process, top portions of vias 172 and 174 may protrude over molding layer 140. This top portion of second via 174 may be selectively removed.

Heat slug 150 may be worked to form first opening 158 and/or a space may be formed in first opening 158 that may expose first conductor 152. First opening 158 may have a depth identical or analogous to a length of the protruded top portion of first via 172. Heat slug 150 may be adhered to molding layer 140 by an adhesive. The adhesive may not be coated on the exposed top surface of second via 174. Through the adhesion process, first via 172 may be connected to first conductor 152 through first opening 158 and/or second via 174 may be connected to second conductor 154 directly.

Plurality of external terminals 180 may be attached to bottom surface 110b of substrate 110, which makes semiconductor package 100. According to example embodiments, first opening 158 may not be filled with insulating material such that an air gap may be formed to isolate first via 172 from second conductor 154.

The space may be filled with conductive material that may constitute a top part of first via 172. Plurality of external terminals 180 may be attached to bottom surface 110b of substrate 110, which makes semiconductor package 100.

Figure 1B:
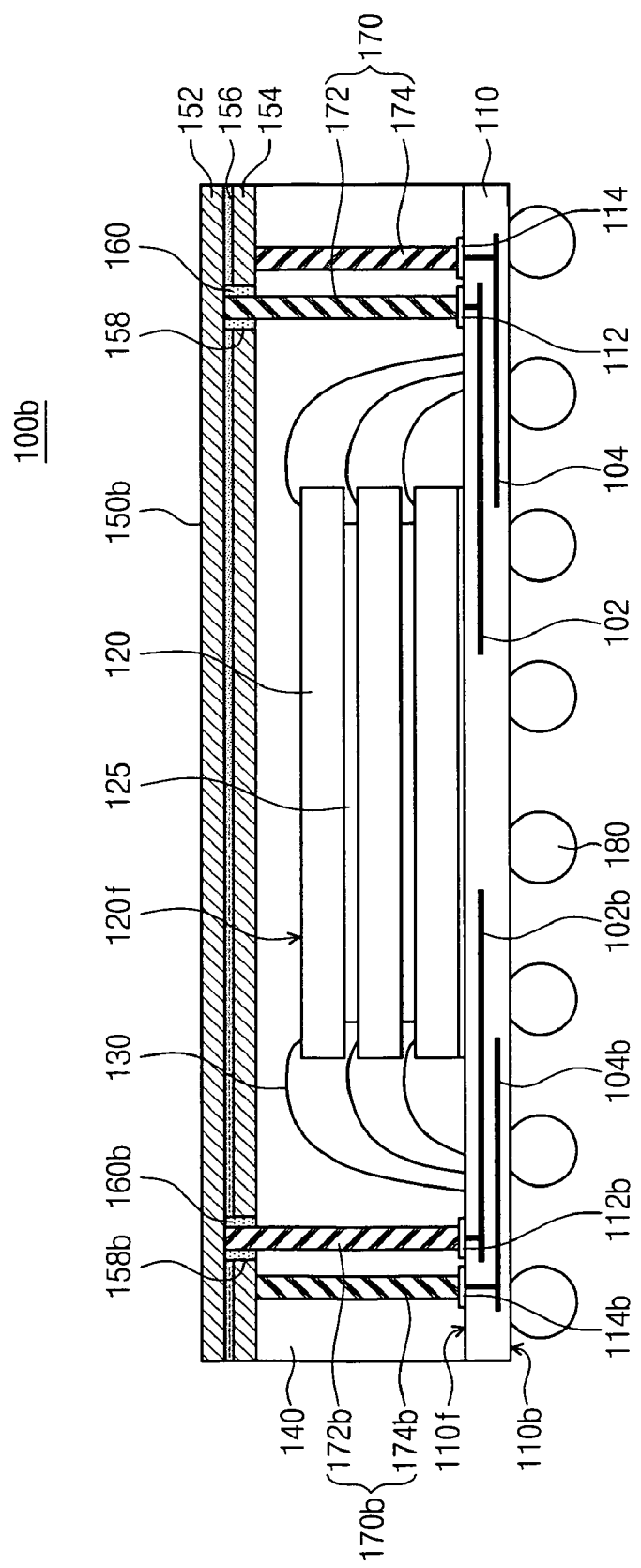
FIG. 1B is a cross sectional view illustrating a semiconductor package according to example embodiments.

FIG. 1B is a cross sectional view illustrating a semiconductor package example embodiments. In the description of the second embodiment and the embodiments that follow, the description of features that are the same as those in FIG. 1A may be omitted in order to avoid repetition. Referring to FIG. 1B, semiconductor package 100b may include heat slug 150b electrically connected to substrate 110 by plurality of through mold via 170 and 170b.

For example, first through mold via 170 may be provided between heat slug 150b and substrate 110. Second through mold via 170b may be further provided between heat slug 150b and substrate 110. First through mold via 170 may comprise first via 172 (e.g., first power via 172) and/or second via 174 (e.g., first ground via 174). Second through mold via 170b may comprise third via 172b (e.g., second power via 172b) and/or fourth via 174b (e.g., second ground via 174b).

First and second power vias 172 and 172b may be commonly connected to first conductor 152 (e.g., power plane 152) of heat slug 150b. First and second ground vias 174 and 174b may be commonly connected to second conductor 154 (e.g., ground plane 154) of heat slug 150b. According to example embodiments, semiconductor package 100b may further comprise second through mold via 170b that may lower the inductance. Therefore, semiconductor package 100b may have improved PI characteristics.

Heat slug 150b may comprise first opening 158 through which first power via 172 may be connected to power plane 152, but first power via 172 may be insulated from ground plane 154. Heat slug 150b may further comprise second opening 158b through which second power via 172b may be connected to power plane 152, but second power via 172b may be insulated from ground plane 154, as well. Second opening 158b may be formed to penetrate ground plane 154 and/or first dielectric 156. First opening 158 may be filled with first insulation layer 160 and/or second opening 158b may be filled with second insulation layer 160b.

First power pad 112 and first ground pad 114 may be provided on top surface 110f of substrate 110. Moreover, there may be further provided second power pad 112b that may be commonly connected to second power via 172b, and/or second ground pad 114b that may be connected to second ground via 174b, on top surface 110f of substrate 110. First power pad 112, together with second power pad 112b, may be connected to electrical member 102 (e.g., first power member 102) for supplying power. First ground pad 114, together with second ground pad 114b, may be connected to electrical member 104 (e.g., first ground member 104) for grounding.

Substrate 110 may further comprise second power member 102b and/or second ground member 104b. First power pad 112 may be connected to first power member 102 and/or second power pad 112b may be connected to second power member 102b. First ground pad 114 may be connected to first ground member 104 and/or second ground pad 114b may be connected to second ground member 104b.

Power supplied by first power member 102 may be identical to or different than that supplied by second power member 102b. For example, first power member 102 may supply high voltage power to semiconductor chip 120, and/or second power member 102b may supply low voltage power to semiconductor chip 120.

Semiconductor package 100b may comprise two through mold vias 170 and 170b but, for example, semiconductor package 100b may comprise a plurality of through mold vias more than two. The other elements and their structural relationships may be identical or similar to those described above with reference to FIG. 1A.

According to example embodiments, first conductor 152 may be a power plane, first and third vias 172 and 172b connected to the first conductor 152 may be power vias, second conductor 154 may be a ground plane, and/or second and fourth vias 174 and 174b connected to second conductor 154 may be ground vias. In the alternative, first conductor 152 may be a ground plane, first and third vias 172 and 172b connected to first conductor 152 may be ground vias, second conductor 154 may be a power plane, and/or second and fourth vias 174 and 174b connected to second conductor 154 may be power vias.

Figure 1C:
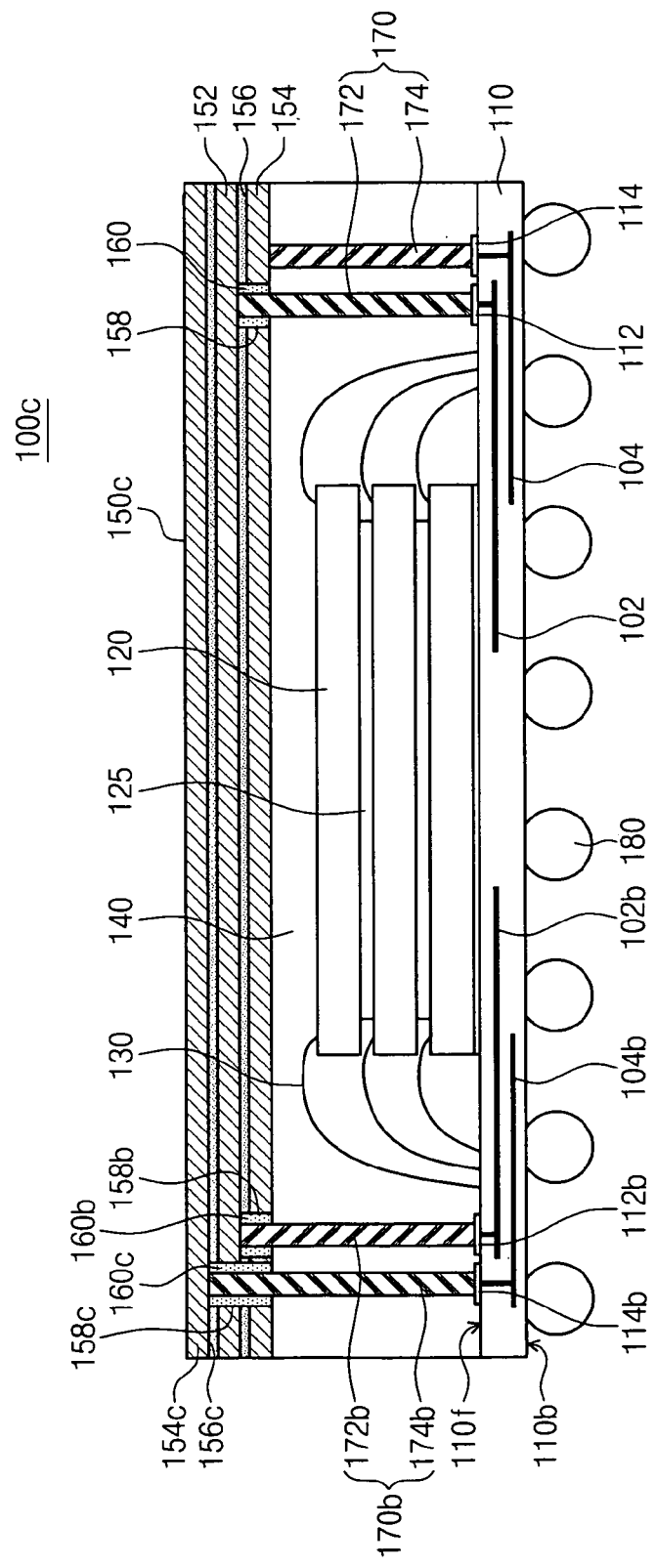
FIG. 1C is a cross sectional view illustrating a semiconductor package according to example embodiments.

FIG. 1C is a cross sectional view illustrating a semiconductor package according to example embodiments. Referring to FIG. 1C, semiconductor package 100c may be a wire bonding package that may include heat slug 150c electrically connected to substrate 110 using plurality of through mold vias 170 and 170b.

Heat slug 150c may be a multiple capacitor-like structure comprising first conductor 152, second conductor 154 disposed under first conductor 152, first dielectric 156 interposed between conductors 152 and 154, third conductor 154c over first conductor 152, and second dielectric 156c interposed between conductors 152 and 154c. One of conductors 152, 154, and 154c may be a power plane and the others may be ground planes. Alternatively, one of conductors 152, 154, and 154c may be a ground plane and the others may be power planes.

First through mold via 170 may comprise first via 172 and/or second via 174, and/or second through mold via 170b may comprise third via 172b and/or fourth via 174b. First and third vias 172 and 172b may be power vias, and/or second and fourth vias 174 and 174b may be ground vias, or vice versa.

Heat slug 150c may comprise first opening 158 providing a space through which first via 172 may be connected to first conductor 152. First opening 158 may be filled with first insulation layer 160 insulating first via 172 from second conductor 154. Heat slug 150c may further comprise second opening 158b providing a space through which third via 172b may be connected to first conductor 152. Second opening 158b may be filled with second insulation layer 160b insulating third via 172b from second conductor 154. Heat slug 150c may still further comprise third opening 158c providing a space through which fourth via 174b may be connected to third conductor 154c. Third opening 158c may be filled with third insulation layer 160c that may insulate fourth via 174b from conductors 152 and 154.

For example, first conductor 152 (or power plane 152) may be connected to both of first via 172 (or first power via 172) of first through mold via 170 and third via 172b (or second power via 172b) of second through mold via 170b. Second conductor 154 (or first ground plane 154) may be connected to second via 174 (or first ground via 174) of first through mold via 170, and/or third conductor 154c (or second ground plane 154c) may be connected to fourth via 174b (or second ground via 174b) of second through mold via 170b.

According to example embodiments, one power plane 152 may be disposed between two ground planes 154 and 154c, which may enlarge capacitance more than a structure having one power plane 152 and one ground plane 154 or one power plane 152 and one ground plane 154c. Therefore, semiconductor package 100c may have much more improved electrical characteristics such as ESD, PI, EMI, etc.

In the alternative, first conductor 152 (or ground plane 152) may be connected to both of first via 172 (or first ground via 172) of first through mold via 170 and/or third via 172b (or second ground via 172b) of second through mold via 170b. Second conductor 154 (or first power plane 154) may be connected to second via 174 (or first power via 174) of first through mold via 170, and/or third conductor 154c (or second power plane 154c) may be connected to fourth via 174b (or second power via 174b) of second through mold via 170b.

According to example embodiments, two power planes 154 and 154c may be disposed on opposite sides of ground plane 152, which may enlarge capacitance more than a structure having one ground plane 152 and one power plane 154 or one ground plane 152 and one power plane 154c.

Figure 1D:
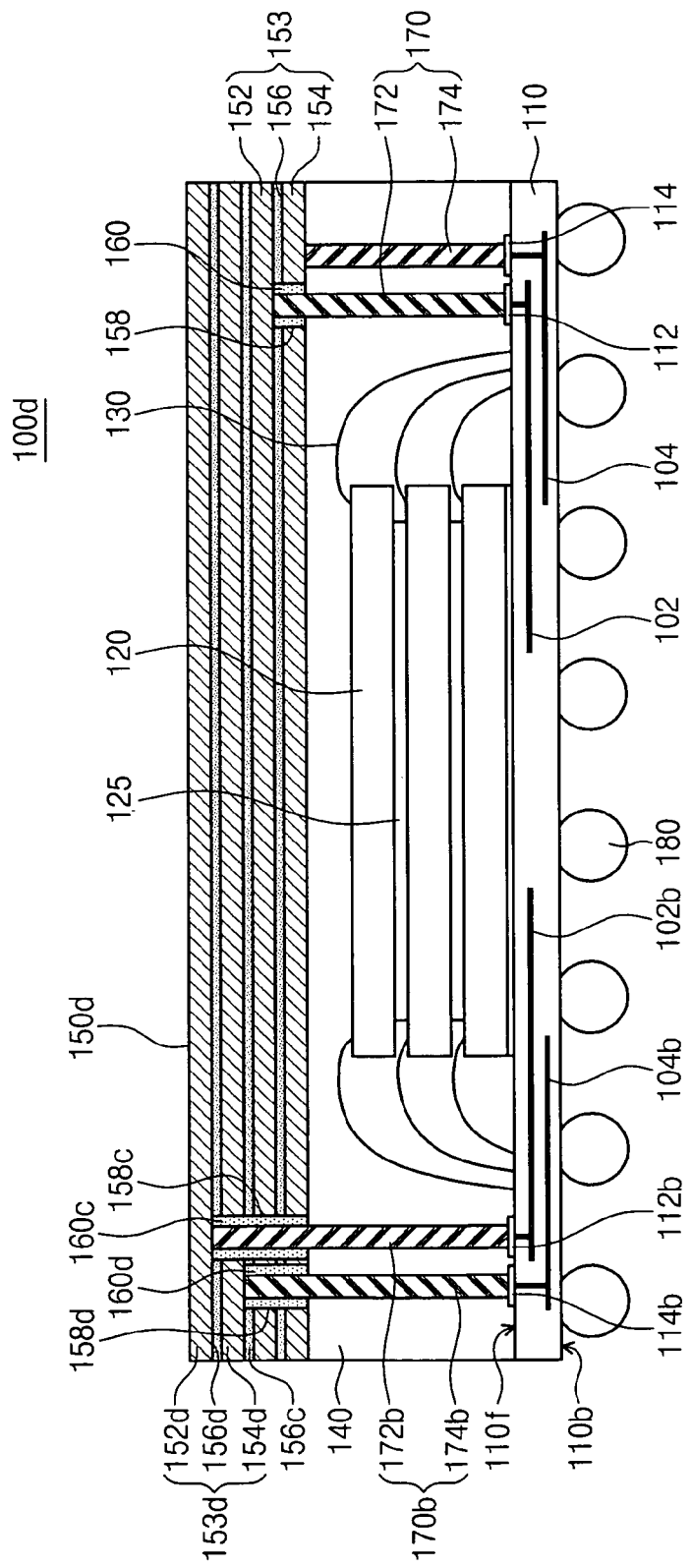
FIG. 1D is a cross sectional view illustrating a semiconductor package according to example embodiments.

FIG. 1D is a cross sectional view illustrating a semiconductor package according to example embodiments. Referring to FIG. 1D, semiconductor package 100d may be a wire bonding package that may include heat slug 150d electrically connected to substrate 110 using plurality of through mold vias 170 and 170b.

Heat slug 150d may comprise first subsidiary heat slug 153 and/or second subsidiary heat slug 153d. For example, first subsidiary heat slug 153 may have a capacitor-like structure that including first dielectric 156 provided between first power plane 152 and first ground plane 154. Similarly, second subsidiary heat slug 153d may have a capacitor-like structure that may include third dielectric 156d provided between second power plane 152d and second ground plane 154d. Second subsidiary heat slug 153d may be stacked on first subsidiary heat slug 153 where an intermediate dielectric 156c is disposed between them.

First subsidiary heat slug 153 may be connected to first through mold via 170, and/or second subsidiary heat slug 153d may be connected to second through mold via 170b. First through mold via 170 may comprise first power via 172 and/or first ground via 174, and/or second through mold via 170b may comprise second power via 172b and/or second ground via 174b. For example, first power via 172 of first through mold via 170 may be connected to first power plane 152 of first subsidiary heat slug 153, and/or first ground via 174 of first through mold via 170 may be connected to first ground plane 154 of first subsidiary heat slug 153. Similarly, second power via 172b of second through mold via 170b may be connected to second power plane 152d of second subsidiary heat slug 153d, and/or second ground via 174b of second through mold via 170b may be connected to second ground plane 154d of second subsidiary heat slug 153d.

Heat slug 150d may comprise first opening 158 through which first power via 172 may be connected to first power plane 152. First opening 158 may penetrate first ground plane 154 and/or first dielectric 156. First insulation layer 160 may fill first opening 158 to insulate first power via 172 from first ground plane 154. Heat slug 150d may further comprise second opening 158c through which second power via 172b may be connected to second power plane 152d. Second opening 158c may penetrate first ground plane 154, first dielectric 156, first power plane 152, second dielectric 156c, second ground plane 154d, and/or third dielectric 156d. Second insulation layer 160c may fill second opening 158c in order to insulate second power via 172b from first ground plane 154, first power plane 152, and/or second ground plane 154d. Heat slug 150d may still further comprise third opening 158d through which second ground via 174b may be connected to second ground plane 154d. Third opening 158d may penetrate first ground plane 154, first dielectric 156, and/or first power plane 152. Third insulation layer 160d may fill third opening 158d in order to insulate second ground via 174b from first ground plane 154 and/or first power plane 152.

According to example embodiments, power plane 152 may be connected to power via 172 and/or power plane 152d may be connected to power via 172b. Similarly, ground plane 154 may be connected to ground via 174 and/or ground plane 154d may be connected to ground via 174b. Therefore, at least two capacitors may be provided in semiconductor packages 100d such that sufficient capacitance may be secured to improve electrical characteristics much more.

Alternatively, power planes 152 and/or 152d may function as ground planes, and/or ground planes 154 and/or 154d may function as power planes. Power vias 172 and/or 172b may perform as ground vias, and/or ground vias 174 and/or 174b may perform as power vias. Ground plane 152 may be connected to ground via 172 and/or ground plane 152d may be connected to ground via 172b. Similarly, power plane 154 may be connected to power via 174 and/or power plane 154d may be connected to power via 174b.

It is understood by a person having ordinary skilled in the art (PHOSITA) that various changes in form and details as shown in FIGS. 1A to 1D may be made without departing from the spirit and scope of the example embodiments.

Figure 2:
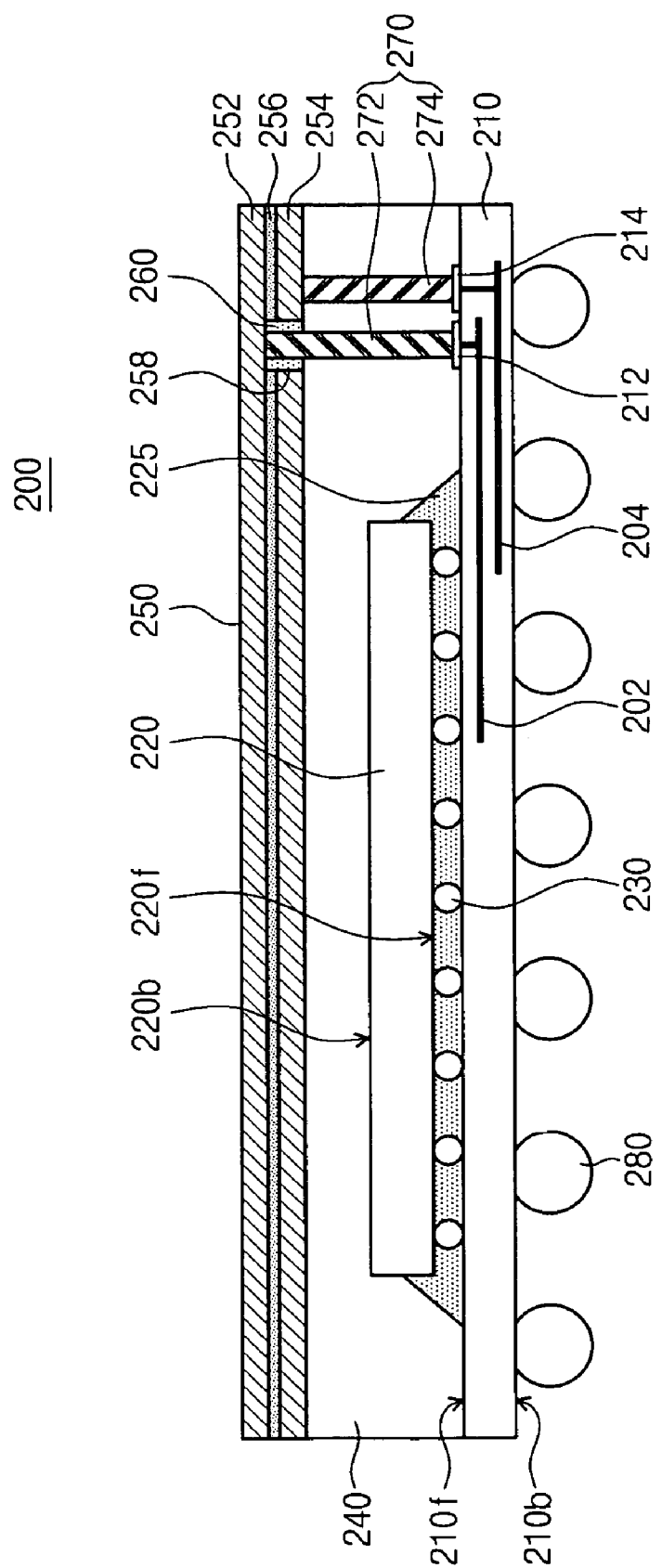
FIG. 2 is a cross sectional view illustrating a semiconductor package according to example embodiments.

FIG. 2 is a cross sectional view illustrating a semiconductor package according to example embodiments. Referring to FIG. 2, semiconductor package 200 may be a flip chip package that may include heat slug 250 electrically connected to substrate 210 using through mold via 270.

For example, semiconductor package 200 may comprise substrate 210 on which semiconductor chip 220 may be mounted. Semiconductor chip 220 may be mounted in a flip state where active surface 220f thereof may face substrate 210 and/or inactive surface 220b thereof may face heat slug 250. Substrate 210 may comprise power member 202 and/or ground member 204. Substrate 210 may be electrically connected to semiconductor chip 220 by at least one interconnection terminal 230, such as a solder bump attached to active surface 220f of semiconductor chip 220. For example, at least one of plurality of interconnection terminals 230 may be connected to power member 202, and/or at least other one of plurality of interconnection terminals 230 may be connected to ground member 204. The others of the plurality of interconnection terminals 230 may be used for providing electrical signal paths for data communication, for example, between semiconductor chip 220 and substrate 210. Underfilling layer 225 may be provided between substrate 210 and semiconductor chip 220. Underfilling layer 225 may ensure the electrical connection between substrate 210 and semiconductor chip 220.

At least one external terminal 280, such as a solder ball, may be attached to bottom surface 210b of substrate 210. Semiconductor chip 220 may be molded by molding layer 240. Heat slug 250 may be provided on molding layer 240. Heat slug 250 may be a planar capacitor-like structure comprising first conductor 252 (e.g., power plane 252), second conductor 254 (e.g., ground plane 254), and dielectric 256 interposed between them.

Through mold via 270 may be provided between heat slug 250 and substrate 210. Through mold via 270 may penetrate molding layer 240. Through mold via 270 may comprise power via 272 connected to power plane 252 and/or ground via 274 connected to ground plane 254. Heat slug 250 may comprise opening 258 through which power via 272 may be connected to power plane 252. Opening 258 may be filled with insulation layer 260 in order to insulate power via 272 from ground plane 254.

Power pad 212 and/or ground pad 214 may be disposed on top surface 210f of substrate 210. Power pad 212 may be connected to power via 272 and/or power member 202, and/or ground pad 214 may be connected to ground via 274 and/or ground member 204. Therefore, power plane 252 may be electrically connected to power member 202 using power via 272, and/or ground plane 254 may be electrically connected to ground member 204 using ground via 274.

The description of features that are the same as or similar to those in FIGS. 1A to 1D may apply to semiconductor package 200 of FIG. 2. For example, plurality of through mold vias 270 may be provided, as shown in FIG. 1B. Heat slug 250 may be a multiple capacitor-like structure, as shown in FIG. 1C, and/or heat slug 250 may comprise a plurality of subsidiary heat slugs that may be stacked one atop the other, as shown in FIG. 1D.

Figure 3:
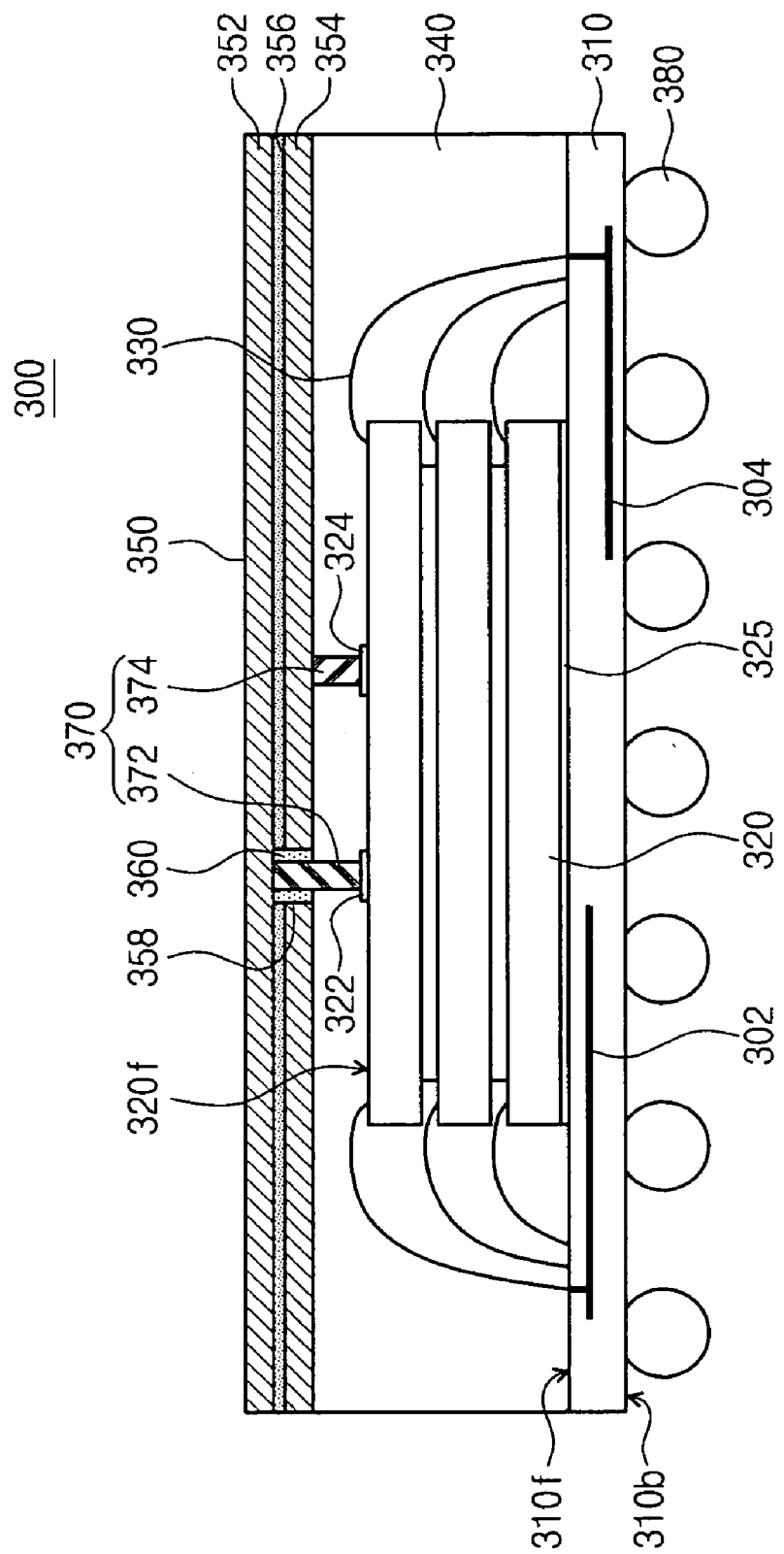
FIG. 3 is a cross sectional view illustrating a semiconductor package according to example embodiments.

FIG. 3 is a cross sectional view illustrating a semiconductor package according to example embodiments. Referring to FIG. 3, semiconductor package 300 may be a wire bonding package that may include heat slug 350 electrically connected to at least one semiconductor chip 320 using through mold via 370.

For example, semiconductor package 300 may comprise through mold via 370 disposed between heat slug 350 and at least one semiconductor chip 320. Heat slug 350 may comprise power plane 352, ground plane 354, and dielectric 356 interposed between them. Through mold via 370 may comprise power via 372 connected to power plane 352, and/or ground via 374 connected to ground plane 354. Heat slug 350 may comprise opening 358 through which power via 372 may be connected to power plane 352. Opening 358 may be filled with insulation layer 360 in order to insulate power via 372 from ground plane 354. Through mold via 370 may be connected to a topmost one of plurality of the semiconductor chips 320.

Power pad 322 and/or ground pad 324 may be disposed on active surface 320f of topmost semiconductor chip 320. Power pad 322 may be electrically connected to power plane 352 using power via 372 and/or ground pad 324 may be electrically connected to ground plane 354 using ground via 374. Power pad 322 and/or ground pad 324 may be electrically connected to substrate 310 using plurality of bonding wires 330. For example, one of plurality of bonding wires 330 may electrically connect power pad 322 to power member 302 of substrate 310, and/or another one of plurality of bonding wires 330 may electrically connect ground pad 324 to ground member 304 of substrate 310. Therefore, power plane 352 may be electrically connected to power member 302 using power via 372, and/or ground plane 354 may be electrically connected to ground member 304 using ground via 374. The other elements and their structural relationships are identical or similar to those described above with reference to FIG. 1A.

According to example embodiments, heat slug 350 may be directly connected to semiconductor chip 320. Therefore, semiconductor package 300 may have a trace between heat slug 350 and semiconductor chip 320 shorter than that of semiconductor chip 120 in which heat slug 150 may be electrically connected to substrate 110, as described in FIG. 1A. The shorter trace may lower inductance and/or impedance such that semiconductor package 300 may have far more improved electrical characteristics. Heat slug 350 may be a planar capacitor-like structure such that high voltage impedance may be improved effectively.

The description of features that are the same as or similar to those in FIGS. 1A to 1D may apply to semiconductor package 300 of FIG. 3. For example, plurality of through mold vias 370 may be provided, as shown in FIG. 1B. Heat slug 350 may be a multiple capacitor-like structure, as shown in FIG. 1C, and/or heat slug 350 may comprise a plurality of subsidiary heat slugs stacked one atop the other, as shown in FIG. 1D.

Adhesion layer 325 may be interposed, for example, between a bottommost one of plurality of semiconductor chips 320 and substrate 310, and/or between plurality of semiconductor chips 320. Adhesion layer 325 may be similar to, for example, adhesion layer 125. Molding layer 340 may be formed on top surface 310f of the substrate 310 in order to mold semiconductor chips 320. Molding layer 340 may be similar to, for example, molding layer 140. Plurality of external terminals 380, such as solder balls, may be attached to bottom surface 310b of substrate 310. External terminals 380 may be similar to, for example, external terminals 180.

FIG. 4 is a cross sectional view illustrating a semiconductor package according to example embodiments. Referring to FIG. 4, semiconductor package 400 may be a flip chip package that may include heat slug 450 electrically connected to semiconductor chip 420 using through mold via 470.

For example, semiconductor package 400 may comprise through mold via 470 that may be interposed between semiconductor chip 420 and heat slug 450. Heat slug 450 may comprise power plane 452, ground plane 454, and dielectric 456 interposed between them. Through mold via 470 may comprise power via 472, connected to power plane 452, and ground via 474, connected to ground plane 454. Heat slug 450 may comprise opening 458 through which power via 472 may be connected to power plane 452. Opening 458 may be filled with insulation layer 460 in order to insulate power via 472 from ground plane 454.

Semiconductor chip 420 may be mounted on top surface 410f of substrate 410 in a flip state, where active surface 420f thereof may face substrate 410 and/or inactive surface 420b thereof may face heat slug 450. Power pad 422 and/or ground pad 424 may be disposed on inactive surface 420b of semiconductor chip 420. Power pad 422 may be electrically connected to power plane 452 using power via 472, and/or ground pad 424 may be electrically connected to ground plane 454 using ground via 474. Semiconductor chip 420 may comprise first through electrode 442 connected to power pad 422 and/or second through electrode 444 connected to ground pad 424. Through electrodes 442 and 444 may be silicon through vias that may penetrate semiconductor chip 420. Substrate 410 may comprise power member 402 and/or ground member 404.

Semiconductor chip 420 may be electrically connected to substrate 410 using at least one interconnection terminal 430 that may be provided on active surface 420f of semiconductor chip 420. For example, first interconnection terminal 432 may be electrically connected to power member 402 and/or second interconnection terminal 434 may be electrically connected to ground member 404. The others of plurality of interconnection terminals 430 may be used for providing electrical signals of data communication between, for example, semiconductor chip 420 and substrate 410. First through electrode 442 may be connected to power member 402 using first interconnection terminal 432, and/or second through electrode 444 may be connected to ground member 404 using second interconnection terminal 434. Therefore, power plane 452 may be electrically connected to power member 402 using power via 472 and/or first through electrode 442, and/or ground plane 454 may be electrically connected to ground member 404 using ground via 474 and/or second through electrode 444.

Underfilling layer 425 may be provided between substrate 410 and semiconductor chip 420. Underfilling layer 425 may ensure the electrical connection between substrate 410 and semiconductor chip 420. The other elements and their structural relationships may be identical or similar to those described above with reference to FIG. 2.

Plurality of through mold vias 470 may be provided between semiconductor chip 420 and heat slug 450, as shown in FIG. 1B. Heat slug 450 may be a multiple capacitor-like structure, as shown in FIG. 1C, and/or heat slug 450 may comprise a plurality of subsidiary heat slugs stacked one atop the other, as shown in FIG. 1D. When plurality of through mold vias 470 may be provided, a plurality of through electrodes 442, 444 may be also provided, as shown in FIG. 1B.

An additional heat slug (not shown), whose structure may be identical or analogous to that of heat slug 450, may be further provided on inactive surface 420b of semiconductor chip 420. Additional heat slugs may be connected to heat slug 450 using through mold via 470. Additional heat slugs may be electrically connected to semiconductor chip 420 using through electrodes 442 and 444, and/or may be electrically connected to power member 402 and/or ground member 404 of substrate 410.

Molding layer 440 may be formed on top surface 410f of the substrate 410 in order to mold semiconductor chips 420.

Molding layer 440 may be similar to, for example, molding layer 140. Plurality of external terminals 480, such as solder balls, may be attached to bottom surface 410b of substrate 410. External terminals 480 may be similar to, for example, external terminals 180.

Figure 5:
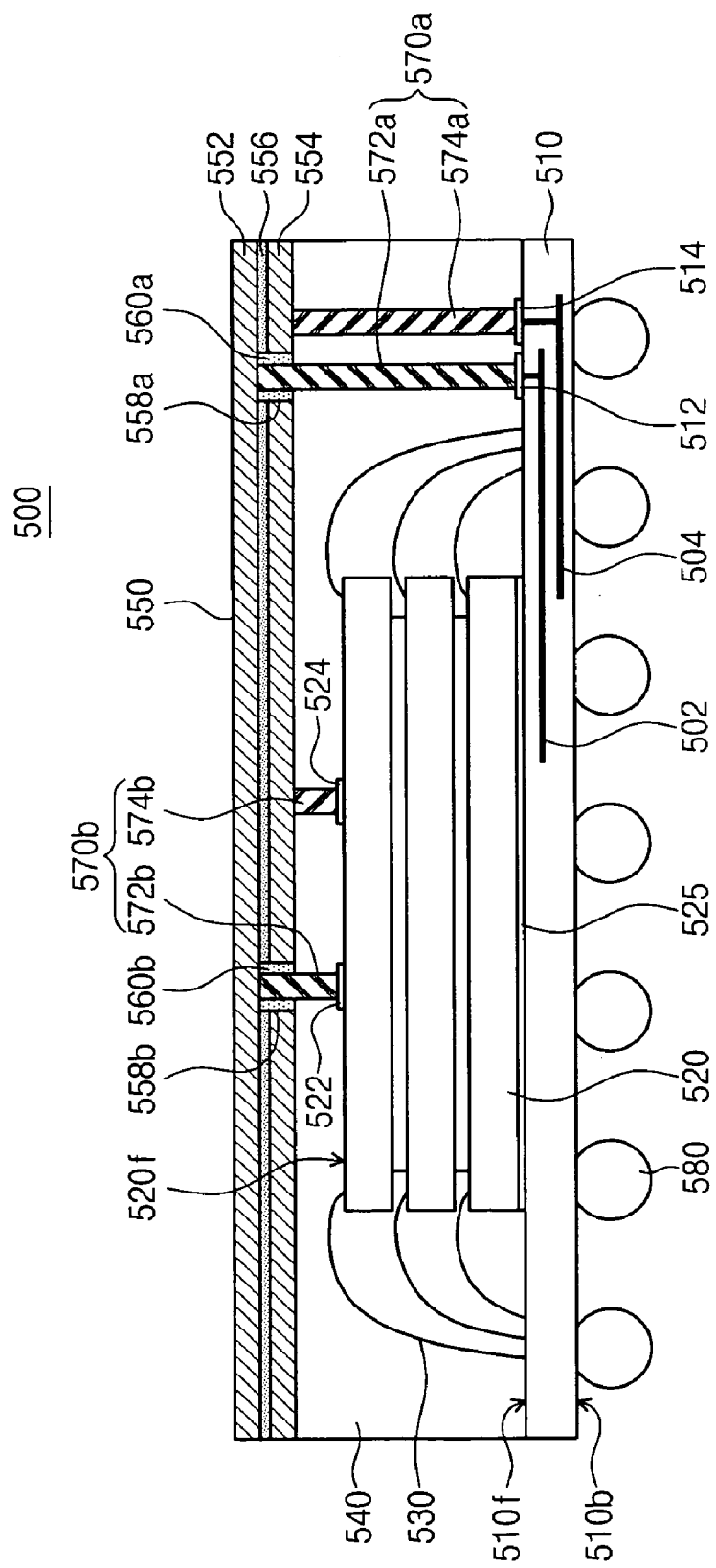
FIG. 5 is a cross sectional view illustrating a semiconductor package according to example embodiments.

FIG. 5 is a cross sectional view illustrating a semiconductor package according to example embodiments. Referring to FIG. 5, semiconductor package 500 may be a wire bonding package in which heat slug 550 may be electrically connected to substrate 510 using first through mold via 570a, while heat slug 550 may be electrically connected to semiconductor chip 520 using second through mold via 570b. The descriptions of through mold vias 570a and 570b may be identical or analogous to those described with reference to FIGS. 1A and 3, respectively.

For example, first through mold via 570a may be disposed between heat slug 550 and substrate 510. First through mold via 570a may comprise first power via 572a and/or first ground via 574a. First power via 572a may be electrically connected to power member 502 using first power pad 512, and/or first ground via 574a may be electrically connected to ground member 504 using first ground pad 514.

Second through mold via 570b may be disposed between heat slug 550 and semiconductor chip 520. Second through mold via 570b may comprise second power via 572b and/or second ground via 574b. Second power via 572b may be electrically connected to semiconductor chip 520 using second power pad 522, and/or second ground via 574b may be electrically connected to semiconductor chip 520 using second ground pad 524. Second power pad 522 and/or second ground pad 524 may be provided on active surface 520f of a topmost one of plurality of semiconductor chips 520. Semiconductor chips 520 may be electrically connected to power member 502 and/or ground member 504 by plurality of bonding wires 530.

Heat slug 550 may comprise power plane 552, ground plane 554, and dielectric 556 interposed between them. Heat slug 550 may comprise first opening 558a, through which first power via 572a may be electrically connected to power plane 552, penetrating ground plane 554 and/or dielectric 556. First opening 558a may be filled with first insulation layer 560a in order to insulate first power via 572a from ground plane 554. Heat slug 550 may further comprise second opening 558b, through which second power via 572b may be connected to power plane 552, penetrating ground plane 554 and/or dielectric 556. Second opening 558b may be filled with second insulation layer 560b in order to insulate second power via 572b from ground plane 554.

As described above, first power via 572a and/or second power via 572b may be connected to power plane 552 of heat slug 550, and/or first ground via 574a and/or second ground via 574b may be connected to ground plane 554 of heat slug 550.

The description of features that are the same as or similar to those in FIGS. 1A to 1D may apply to semiconductor package 500 of FIG. 5. For example, at least one of through mold vias 570a and 570b may be provided in plurals, as shown in FIG. 1B. Heat slug 550 may be a multiple capacitor-like structure, as shown in FIG. 1C, and/or may comprise a plurality of subsidiary heat slugs that may be stacked one atop the other, as shown in FIG. 1D.

Adhesion layer 525 may be interposed, for example, between a bottommost one of plurality of semiconductor chips 520 and substrate 510, and/or between plurality of semiconductor chips 520. Adhesion layer 525 may be similar to, for example, adhesion layer 125. Molding layer 540 may be formed on top surface 510f of substrate 510 in order to mold semiconductor chips 520. Molding layer 540 may be similar to, for example, molding layer 140. Plurality of external terminals 580, such as solder balls, may be attached to bottom surface 510b of substrate 510. External terminals 580 may be similar to, for example, external terminals 180.

Figure 6:
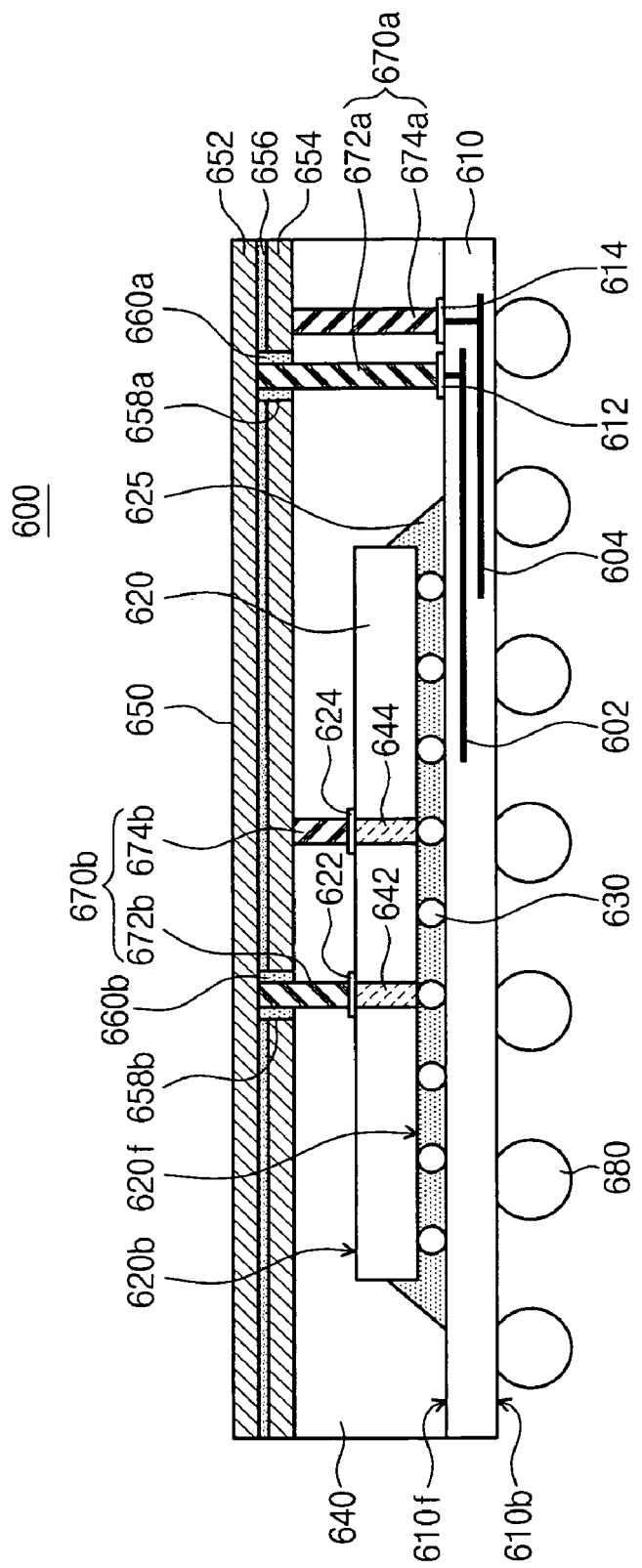
FIG. 6 is a cross sectional view illustrating a semiconductor package according to example embodiments.

FIG. 6 is a cross sectional view illustrating a semiconductor package according to example embodiments. Referring to FIG. 6, semiconductor package 600 may be a flip chip package in which heat slug 650 may be electrically connected to substrate 610 by first through mold via 670a, while heat slug 650 may be electrically connected to semiconductor chip 620 by second through mold via 670b, first through electrode 642, and/or second through electrode 644. The description of first through mold via 670a may be identical or analogous to that described in FIG. 2 for through mold via 270, and/or the descriptions of second through mold via 670b, first through electrode 642, and/or second through electrode 644 may be identical or analogous to those described in FIG. 4 for through mold via 470, first through electrode 442, and/or second through electrode 444.

For example, heat slug 650 may comprise power plane 652, ground plane 654, and dielectric 656 interposed between them. First through mold via 670a may be interposed between heat slug 650 and substrate 610. First through mold via 670a may comprise first power via 672a electrically connecting power plane 652 to first power pad 612, and/or first ground via 674a electrically connecting ground plane 654 to first ground pad 614. First power pad 612 and/or first ground pad 614 may be provided on top surface 610f of substrate 610. First power pad 612 may be electrically connected to power member 602, and/or first ground pad 614 may be electrically connected to ground member 604.

Second through mold via 670b may be interposed between heat slug 650 and semiconductor chip 620. Second through mold via 670b may comprise second power via 672b, that may electrically connect power plane 652 to a second power pad 622, and/or second ground via 674b, that may electrically connect ground plane 654 to second ground pad 624. Second power pad 622 and/or second ground pad 624 may be provided on inactive surface 620b of semiconductor chip 620.

Semiconductor chip 620 may be mounted on top surface 610f of substrate 610 in a flip state where active surface 620f thereof may face substrate 610 and/or inactive surface 620b thereof may face heat slug 650. Semiconductor chip 620 may comprise first through electrode 642 electrically connected to second power via 672b using second power pad 622, and/or second through electrode 644 electrically connected to second ground via 674b using second ground pad 624. First through electrode 642 may be electrically connected to power member 602 and/or second through electrode 644 may be electrically connected to ground member 604, using plurality of interconnection terminals 630.

Heat slug 650 may comprise first opening 658a, through which first power via 672a may be connected to power plane 652, penetrating ground plane 654 and/or dielectric 656. First opening 658a may be filled with first insulation layer 660a in order to insulate first power via 672a from ground plane 654. Heat slug 650 may further comprise second opening 658b, through which second power via 672b may be connected to power plane 652, penetrating ground plane 654 and/or dielectric 656. Second opening 658b may be filled with second insulation layer 660b in order to insulate second power via 672b from ground plane 654.

As described above, first power via 672a and/or second power via 672b may be connected to power plane 652 of heat slug 650, and/or first ground via 674a and/or second ground via 674b may be connected to ground plane 654 of heat slug 650.

The description of features that are the same as or similar to those in FIGS. 1A to 1D may apply to semiconductor package 600 of FIG. 6. For example, at least one of through mold vias 670a and 670b may be provided in plurals, as shown in FIG. 1B. Heat slug 650 may be a multiple capacitor-like structure, as shown in FIG. 1C, and/or may comprise a plurality of subsidiary heat slugs that may be stacked one atop the other, as shown in FIG. 1D. When second through mold via 670b may be provided in plurals, each of through mold electrodes 642 and 644 may be provided in plurals, as shown in FIG. 1B.

Underfilling layer 625 may be provided between substrate 610 and semiconductor chip 620. Underfilling layer 625 may be similar to, for example, underfilling layer 225. Molding layer 640 may be formed on top surface 610f of substrate 610 in order to mold semiconductor chips 620. Molding layer 640 may be similar to, for example, molding layer 140. Plurality of external terminals 680, such as solder balls, may be attached to bottom surface 610b of substrate 610. External terminals 680 may be similar to, for example, external terminals 180.

Figure 8:
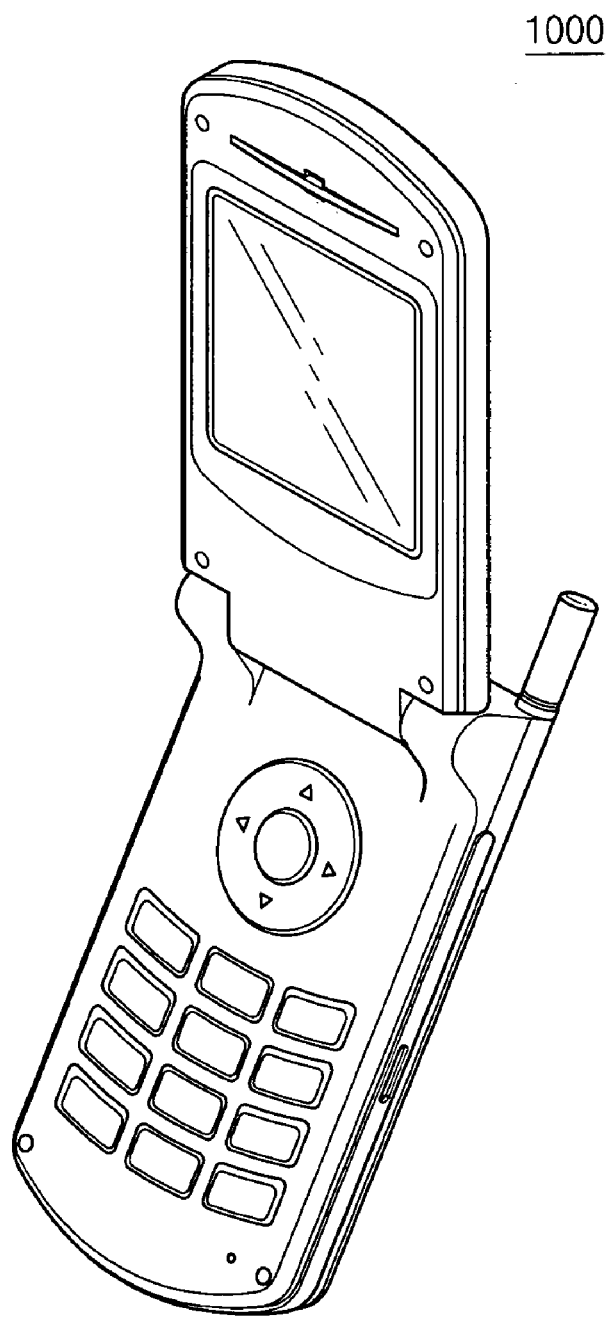
FIG. 8 is a perspective view illustrating an electronic apparatus that includes a semiconductor package according to example embodiments.

FIG. 8 is a perspective view illustrating an electronic apparatus that may include a semiconductor package according to example embodiments. Referring to FIG. 8, the semiconductor packages according to example embodiments may be applicable to electronic apparatus 1000, such as a cell phone. Since the semiconductor packages may have improved thermal and/or electrical characteristics, reliability of electronic apparatus 1000 may be secured even under severe environments. Electronic apparatus 1000 may comprise mobile electronic devices, laptop computers, portable multimedia players (PMPs), MP3 players, camcorders, memory sticks, memory cards, etc.

Figure 9:
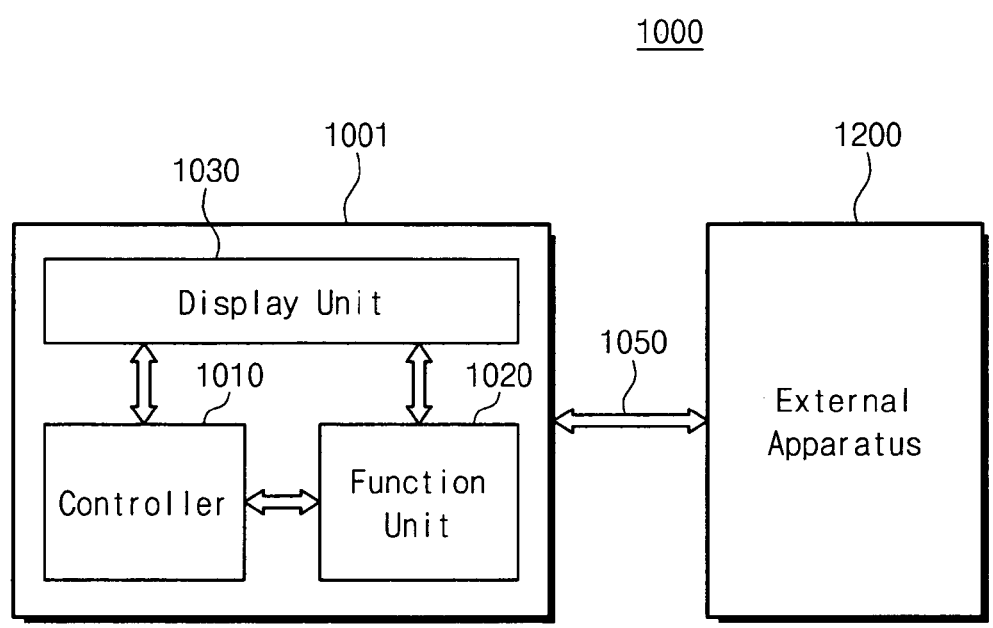
FIG. 9 is a block diagram illustrating the electronic apparatus of FIG. 8.

FIG. 9 is a block diagram illustrating electronic apparatus 1000 of FIG. 8. Referring to FIG. 9, electronic apparatus 1000 may comprise body 1001, controller 1010, function unit 1020, and/or display unit 1030. Controller 1010, function unit 1020, and/or display unit 1030 may be interposed within or on body 1001. Display unit 1030 may be interposed on a surface of body 1001 in order to display images processed by controller 1010 and/or function unit 1020.

Controller 1010 may control function unit 1020 and/or display unit 1030. Function unit 1020 may operate any function of electronic apparatus 1000. For example, if electronic apparatus 1000 may be a mobile phone, function unit 1020 may comprise a plurality of elements to operate functions of the mobile phone, such as dialing, outputting images on display unit 1030 by communicating with external apparatus 1200, outputting sounds on the speaker(s), and so forth. Function unit 1020 may communicate with external apparatus 1200 using wire or wireless communication unit 1050. The semiconductor packages according to example embodiments may be used, for example, as at least one of controller 1010 and function unit 1020. For example, external terminals 180, such as solder balls or bumps attached to bottom surface 110b of substrate 110 (e.g., FIG. 1), may be connected to bonding pads of controller 1010 and/or function unit 1020. Controller 1010 and/or function unit 1020 may need at least one memory or processing unit. For example, the semiconductor packages according to example embodiments may be used as the at least one memory and/or processing unit.

While example embodiments have been particularly shown and described, it will be understood by those of ordinary skill in the art that various changes in form and details may be made therein without departing from the spirit and scope of the present invention as defined by the following claims.

What is claimed is:

1. A semiconductor package, comprising:
at least one semiconductor chip mounted on a substrate;
a molding layer adapted to mold the at least one semiconductor chip;
a heat slug, on the molding layer, having a structure in which a dielectric is provided between conductors; and
a through mold via electrically connecting the heat slug to the substrate,
wherein the through mold via includes a first via electrically connecting one of the conductors to the substrate and a second via electrically connecting another one of the conductors to the substrate,
wherein the heat slug includes first and second openings,
wherein the first opening provides a first space through which the first via is connected to the one of the conductors, but insulated from the another one of the conductors, the first opening penetrating the dielectric and the another one of the conductors, and
wherein the second opening provides a second space through which the second via is connected to the another one of the conductors, but insulated from the one of the conductors, the second opening penetrating the dielectric and the one of the conductors.

2. A semiconductor comprising:
at least one semiconductor chip mounted on a substrate;
a molding layer adapted to mold the at least one semiconductor chip;
a heat slug, on the molding layer, having a structure in which a dielectric is provided between conductors; and
a through mold via electrically connecting the heat slug to the substrate,
wherein the through mold via includes
a first through mold via including a first power via and a first ground via, the first through mold via directly connecting the heat slug to the substrate; and
a second through mold via including a second power via and a second ground via, the second through mold via directly connecting the heat slug to the at least one semiconductor chip such that the heat slug is indirectly connected to the substrate.

3. The semiconductor package of claim 2, wherein the substrate comprises:
a first power pad connected to the first power via; and
a first ground pad connected to the first ground via.

4. The semiconductor package of claim 2, wherein the at least one semiconductor chip comprises:
a second power pad connected to the second power via; and
a second ground pad connected to the second ground via.

5. The semiconductor package of claim 4, wherein the at least one semiconductor chip comprises:
a first through electrode electrically connected to the second power via using the second power pad; and
a second through electrode electrically connected to the second ground via using the second ground pad.

6. The semiconductor package of claim 2, wherein the heat slug comprises:
a power plane to which the first and second power vias are connected together; and
a ground plane to which the first and second ground vias are connected together.

7. The semiconductor package of claim 2, wherein the heat slug comprises:
- a power plane to which the first and second power vias are connected together;
- a first ground plane to which the first ground via is connected; and
- a second ground plane to which the second ground via is connected.

8. The semiconductor package of claim 7, wherein the power plane is provided between the first and second ground planes.

9. The semiconductor package of claim 2, wherein the heat slug comprises:
- a ground plane to which the first and second ground planes are connected together;
- a first power plane to which the first power via is connected; and
- a second power plane to which the second power via is connected.

10. The semiconductor package of claim 9, wherein the ground plane is provided between the first and second power planes.

11. The semiconductor package of claim 2, wherein the heat slug comprises:
- a first subsidiary heat slug, including a first power plane to which the first power via is connected and a first ground plane to which the first ground via is connected; and
- a second subsidiary heat slug, including a second power plane to which the second power via is connected and a second ground plane to which the second ground via is connected.

12. The semiconductor package of claim 11, wherein the first subsidiary heat slug is on the second subsidiary heat slug.

13. The semiconductor package of claim 11, wherein the second subsidiary heat slug is on the first subsidiary heat slug.

14. The semiconductor package of claim 2, further comprising:
- a plurality of semiconductor chips mounted on the substrate.

15. The semiconductor package of claim 2, further comprising:
- two or more semiconductor chips stacked on top of each other.

16. The semiconductor package of claim 2, wherein the heat slug acts as a capacitor in order to improve power integrity of the semiconductor package.

17. The semiconductor package of claim 2, wherein the heat slug acts as a capacitor in order to improve signal integrity of the semiconductor package.

* * * * *